US011071236B2

(12) United States Patent
Grabon

(10) Patent No.: US 11,071,236 B2
(45) Date of Patent: Jul. 20, 2021

(54) AIR MANAGEMENT SYSTEM FOR ROOM CONTAINING ELECTRICAL EQUIPMENT

(71) Applicant: Carrier Corporation, Palm Beach Gardens, FL (US)

(72) Inventor: Michel Grabon, Bresolles (FR)

(73) Assignee: CARRIER CORPORATION, Palm Beach Gardens, FL (US)

( * ) Notice: Subject to any disclaimer, the term of this patent is extended or adjusted under 35 U.S.C. 154(b) by 0 days.

(21) Appl. No.: 16/838,596

(22) Filed: Apr. 2, 2020

(65) Prior Publication Data

US 2020/0329588 A1 Oct. 15, 2020

(30) Foreign Application Priority Data

Apr. 4, 2019 (EP) ..................................... 19305445

(51) Int. Cl.
*H05K 7/20* (2006.01)
(52) U.S. Cl.
CPC ..... *H05K 7/20736* (2013.01); *H05K 7/20172* (2013.01); *H05K 7/20836* (2013.01)
(58) Field of Classification Search
CPC ........... H05K 7/20736; H05K 7/20172; H05K 7/20836; H05K 7/20745; H05K 7/1497; H05K 5/0213; H05K 7/20754; H05K 7/1488; H05K 7/20709; H05K 7/20; H05K 7/20145; H05K 7/20554; H05K 7/20827;

(Continued)

(56) References Cited

U.S. PATENT DOCUMENTS 6,034,873 A * 3/2000 Ståhl .................. H05K 7/20745
165/80.3
6,494,050 B2 12/2002 Spinazzola et al.
6,817,199 B2 11/2004 Patel et al.
(Continued)

FOREIGN PATENT DOCUMENTS

| CN | 106482259 A | 3/2017 |
| WO | 2012140466 A1 | 10/2012 |
| WO | 2019019151 A1 | 1/2019 |

OTHER PUBLICATIONS

European Search Report for European Patent Application No. 19305445.9 completed Oct. 15, 2019.

*Primary Examiner* — Mandeep S Buttar
(74) *Attorney, Agent, or Firm* — Carlson, Gaskey & Olds, P.C.

(57) ABSTRACT

An example air management system includes laterally spaced apart rows of electrical equipment that each provide a flow path between two convection regions on opposing sides of the row. A plurality of supply aisles and a plurality of return aisles are interposed between each other. Each supply and return aisle has a respective room portion that includes a respective one of the convection regions, a respective ceiling portion disposed above the room portion, and a vented barrier portion therebetween. Each supply aisle provides airflow downwards from its ceiling portion to its convection region, and each return aisle provides airflow flow upwards from its convection region to its ceiling portion. A plurality of air handling units are located external to the plurality of rows and are configured to utilize the ceiling portions of the supply aisles as supply ducts, and utilize the ceiling portions of the return aisles as return ducts.

18 Claims, 8 Drawing Sheets

(58) Field of Classification Search
CPC ........... H05K 7/20009; H05K 7/20136; H05K 7/20209; G06F 1/20; G06F 1/206
USPC .... 361/679.48, 679.46, 679.47, 690, 679.49, 361/679.5
See application file for complete search history.

(56) References Cited

U.S. PATENT DOCUMENTS

| | | |
|---|---|---|
| 6,859,366 B2 | 2/2005 | Fink |
| 7,430,118 B1 | 4/2008 | Noteboom et al. |
| 7,534,167 B2 | 5/2009 | Day |
| 7,752,858 B2 | 7/2010 | Johnson et al. |
| 8,473,265 B2 | 6/2013 | Hlasney et al. |
| 8,498,114 B2 | 7/2013 | Martini |
| 8,532,838 B2 | 9/2013 | Allard et al. |
| 8,984,906 B2 | 3/2015 | Tozer |
| 9,101,080 B2 | 8/2015 | Czamara et al. |
| 9,485,887 B1 | 11/2016 | Eichelberg et al. |
| 9,572,288 B2 | 2/2017 | Wilcox et al. |
| 9,723,759 B2 | 8/2017 | Heydari et al. |
| 9,727,064 B2 | 8/2017 | VanGilder et al. |
| 9,788,455 B1 | 10/2017 | Roy |
| 9,901,011 B2 | 2/2018 | Heim et al. |
| 9,918,412 B2 | 3/2018 | Morales |
| 2006/0065000 A1* | 3/2006 | Belady ................. H05K 7/2079 62/259.2 |
| 2012/0087087 A1 | 4/2012 | Nicolai et al. |
| 2017/0027086 A1 | 1/2017 | Noteboom et al. |
| 2017/0118874 A1 | 4/2017 | Lin et al. |
| 2019/0045669 A1 | 2/2019 | Dawson |

\* cited by examiner

AIR MANAGEMENT SYSTEM FOR ROOM CONTAINING ELECTRICAL EQUIPMENT

CROSS-REFERENCE TO RELATED APPLICATION

This application claims the benefit of European Patent Application No. 19305445.9 which was filed on Apr. 4, 2019, and is incorporated by reference herein in its entirety.

BACKGROUND

This application relates to thermal conditioning of air, and more particularly to cooling a room containing electrical equipment, such as server rooms.

Server rooms are commonly used in environments such as data centers. Server rooms contain rows of rack-mounted servers can generate a large amount of heat. Typically, such rooms are cooled by providing cooled supply air through the floor of the room, and recovering hot air from above the rows of server racks, such as in a ceiling area. Another known design involves recovering hot air from the side of a server room instead of in a ceiling area. These prior art designs have required considerable space within buildings and can result in non-uniform air temperature and velocity fields.

SUMMARY

An air management system according to an example of the present disclosure includes a plurality of rows of electrical equipment that are laterally spaced apart from each other, each row providing a flow path from a convection region on a first side of the row to a different convection region on an opposite second side of the row. A plurality of supply aisles and a plurality of return aisles are interposed between each other, each supply aisle and each return aisle having a respective room portion that includes a respective one of the convection regions, a respective ceiling portion disposed above the room portion, and a vented barrier portion therebetween. Each supply aisle provides airflow downwards from its respective ceiling portion through its vented barrier portion to its convection region, and each return aisle provides airflow flow upwards from its convection region through its vented barrier portion to its respective ceiling portion. A plurality of air handling units (AHUs) are located external to the plurality of rows and are configured to utilize the ceiling portions of the supply aisles as supply ducts, and utilize the ceiling portions of the return aisles as return ducts.

In a further embodiment of any of the foregoing embodiments, the ceiling portions are separated by partitions substantially parallel to the rows of electrical equipment.

In a further embodiment of any of the foregoing embodiments, the ceiling portions are equally spaced apart from a floor of a room in which the plurality of rows of electrical equipment are disposed.

In a further embodiment of any of the foregoing embodiments, a supply manifold and a return manifold are disposed at an end of the ceiling portions and are transverse to the rows of electrical equipment. Each of a plurality of first fans is associated with the supply manifold and is configured to provide airflow between the supply manifold and the ceiling portion of an associated one the supply aisles. Each of a plurality of second fans are associated with the return manifold and are configured to provide airflow between the return manifold and the ceiling portion of an associated one of the return aisles. Each first fan and each second fan is configured to provide airflow into its associated ceiling portion from its associated manifold in a first mode, and provide airflow into its associated manifold from its associated ceiling portion in a second mode.

In a further embodiment of any of the foregoing embodiments, each fan is configured to have a normal mode in which airflow is provided in a first direction, and a reverse mode in which airflow is provided in an opposing second direction. Each fan delivers less airflow in the second direction in the reverse mode at a given rotational speed than in the first direction in the normal mode at the given rotational speed. For the first fans, the first mode is the normal mode, and the second mode is the reverse mode; and for the second fans, the first mode is the reverse mode, and the second mode is the normal mode.

In a further embodiment of any of the foregoing embodiments, the supply manifold is stacked above or beneath the return manifold, such that each first fan is arranged in a first row, and each second fan is disposed in a second row that is vertically offset from the first row.

In a further embodiment of any of the foregoing embodiments, a controller is configured to detect a performance deficiency in a particular one of the AHUs associated with a particular supply aisle and a particular return aisle. The controller is configured to, based on the detection, operate each first fan associated with the particular supply aisle in the first mode and at one or more first speeds, and operate each second fan associated with the particular return aisle in the second mode and at one or more second speeds.

In a further embodiment of any of the foregoing embodiments, the controller is configured to, based on the detection, operate each first fan not associated with the particular supply aisle in the second mode at one or more speeds that are less than the one or more first speeds, and operate each second fan not associated with the particular return aisle in the first mode and at one or more speeds that are less than the one or more second speeds.

In a further embodiment of any of the foregoing embodiments, the controller is configured to maintain the plurality of first fans and second fans in an off state based on a lack of performance deficiencies in the plurality of AHUs.

In a further embodiment of any of the foregoing embodiments, to detect a performance deficiency in a particular one of the AHUs, the controller is configured to detect that the particular one of the AHUs is non-operational.

In a further embodiment of any of the foregoing embodiments, to detect a performance deficiency in a particular one of the AHUs, the controller is configured to detect that the particular one of the AHUs is unable to meet a temperature setpoint.

A method of cooling a room containing electrical equipment according to an example of the present disclosure includes providing respective flow paths through each of a plurality of rows of electrical equipment that are laterally spaced apart from each other in the room, each flow path extending from a convection region on a first side of a given row to a different convection region on an opposite second side of the given row. For each of a plurality of supply aisles, a downward airflow is provided from a ceiling portion of the supply aisle through a respective vented barrier portion into the convection region of a room portion of the supply aisle. For each of a plurality of return aisles, an upward airflow is provided from the convection region of a room portion of the return aisle, through a respective vented barrier portion, into a ceiling portion of the return aisle. The supply aisles and return aisles are interposed between each other. A plurality of AHUs utilizing the ceiling portions of the supply aisles as supply ducts, and utilize the ceiling portions of the return aisles as return ducts.

In a further embodiment of any of the foregoing embodiments, the method includes separating the ceiling portions by a plurality of partitions that are substantially parallel to the rows of electrical equipment.

In a further embodiment of any of the foregoing embodiments, the method includes providing each ceiling portion at a same distance from a floor of the room.

In a further embodiment of any of the foregoing embodiments, the method includes providing a supply manifold and a return manifold at an end of the ceiling portions, the supply manifold and return manifold transverse to the rows of electrical equipment. A plurality of first fans are provided that are each associated with the supply manifold and are configured to provide airflow between the supply manifold and the ceiling portion of an associated one the supply aisles. A plurality of second fans are provided that are each associated with the return manifold and are configured to provide airflow between the return manifold and the ceiling portion of an associated one of the return aisles. Each first fan and each second fan is configured to provide airflow into its associated ceiling portion from its associated manifold in a first mode, and provide airflow into its associated manifold from its associated ceiling portion in a second mode.

In a further embodiment of any of the foregoing embodiments, each fan is configured to have a normal mode in which airflow is provided in a first direction, and a reverse mode in which airflow is provided in an opposing second direction. Each fan delivers less airflow in the second direction in the reverse mode at a given rotational speed than in the first direction in the normal mode at the given rotational speed. Operating the first fans in the first mode comprises operating the first fans in the normal mode. Operating the first fans in the second mode comprises operating the first fans in the reverse mode. Operating the second fans in the first mode comprises operating the first fans in the reverse mode. Operating the second fans in the second mode comprises operating the first fans in the normal mode.

In a further embodiment of any of the foregoing embodiments, providing the plurality of first fans includes providing the plurality of first fans in a first row, and providing the plurality of second fans includes providing the plurality of second fans in a second row that is stacked above or below the first row.

In a further embodiment of any of the foregoing embodiments, the method includes detecting a performance deficiency in a particular one of the AHUs associated with a particular supply aisle and a particular return aisle. Based on the detection, each first fan associated with the particular supply aisle is operated in the first mode and at one or more first speeds, and each second fan associated with the particular return aisle is operate in the second mode and at one or more second speeds.

In a further embodiment of any of the foregoing embodiments, the method includes, based on the detecting, operating each first fan not associated with the particular supply aisle in the second mode at one or more speeds that are less than the one or more first speeds, and operating each second fan not associated with the particular return aisle in the first mode and at one or more speeds that are less than the one or more second speeds.

In a further embodiment of any of the foregoing embodiments, the method includes maintaining the plurality of first fans and second fans in an off state based on a lack of performance deficiencies in the plurality of AHUs.

In a further embodiment of any of the foregoing embodiments, detecting a performance deficiency in a particular one of the AHUs includes detecting that the particular one of the AHUs is non-operational.

In a further embodiment of any of the foregoing embodiments, detecting a performance deficiency in a particular one of the AHUs includes detecting that the particular one of the AHUs is unable to meet its temperature setpoint.

The embodiments, examples, and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

DETAILED DESCRIPTION

Figure 1:
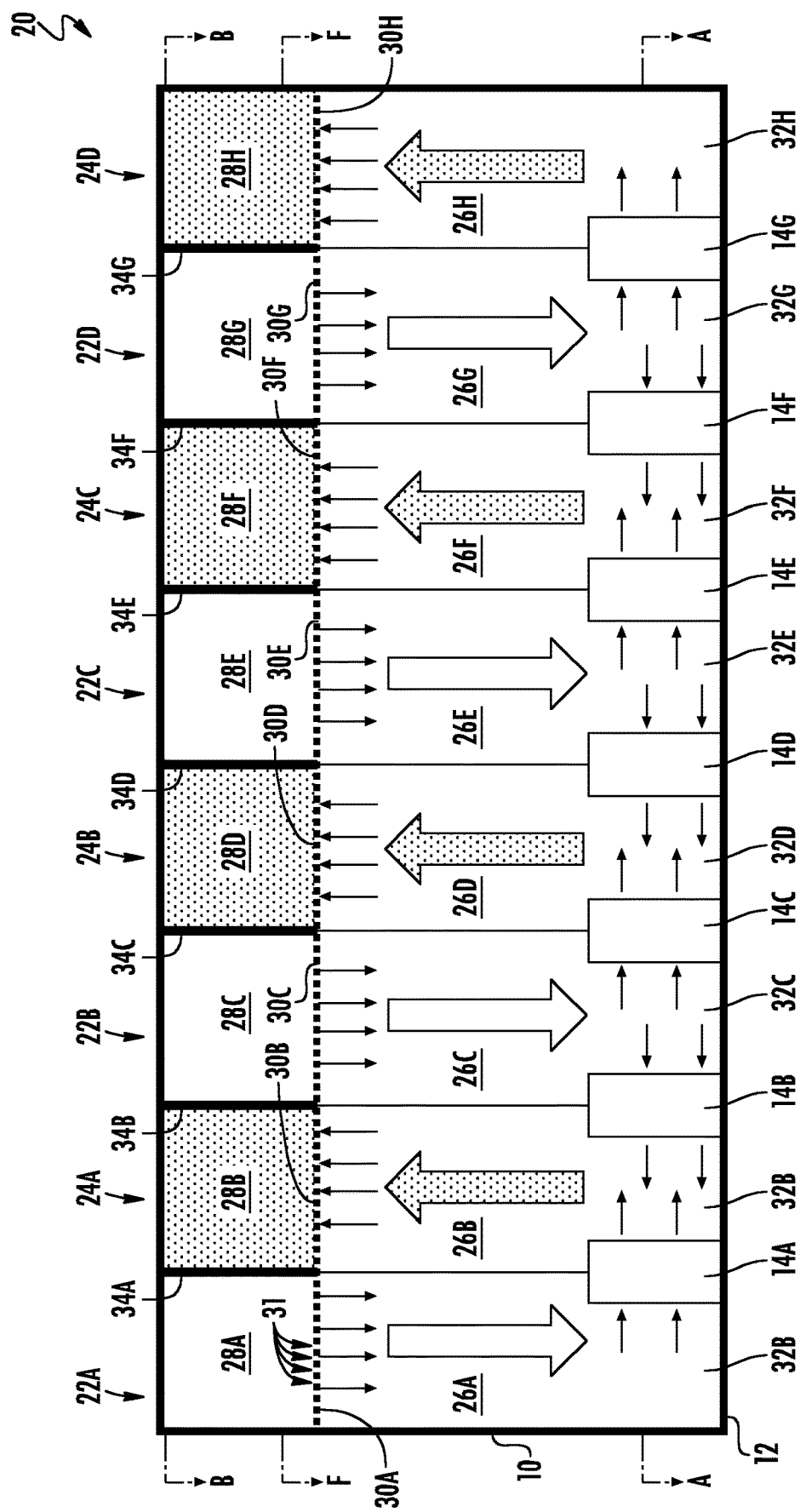
FIG. 1 is a schematic side view of an example room containing rows of electrical equipment.

FIG. 1 is a schematic side view of an example room 10 which includes a floor 12, and a plurality of rows 14 of electrical equipment that are situated on the floor 12 and are laterally spaced apart from each other and are substantially parallel to each other. The rows 14 of electrical equipment could include rows of rack-mounted servers, information technology equipment (e.g., routers and/or switches), or some other electronic equipment, for example. Although server racks are a non-limiting example, they will be discussed below as an illustrative example.

The room 10 includes an air management system 20 which includes a plurality of supply aisles 22A-D and a plurality of return aisles 24A-D that are interposed between each other. Each supply aisle 22 and return aisle includes a respective room portion 26, a respective ceiling portion 28 disposed above the room portion, and a respective vented barrier portion 30 that is disposed between the room portion 26 and the ceiling portion 28. Also, each room portion 26 includes a convection region 32.

Each of the plurality of rows 14 provides a flow path from a convection region 32 on a first side of the row 14 to a different convection region 32 on an opposite second side of the row. For example, row 14A provides a flow path from convection region 32A to convection region 32B, and row 14B provides a flow path from convection region 32C to convection region 32B.

Each supply aisle 22 provides airflow of cooled air downwards from its respective ceiling portion 28 through its vented barrier portion 30 to its convection region 32. The cooled air flows from the convection region 32 through a row 14 to a convection region 32 of a neighboring return aisle 24, and accepts heat from the servers in the row 14 along the way. Each return aisle 24 provides airflow of heated air upwards from its convection region 32 through its vented barrier portion 30 to its ceiling portion 28.

Each vented barrier portion 30 includes a plurality of openings 31 that are substantially directed towards the convection region 32 associated with the vented barrier portion 30. Taking supply aisle 22A as an example, its openings 31 are substantially directed to the convection region 32A. In one example, the vented barrier portions 30 include one or more perforated ceiling panels and/or include vents at discrete locations along the vented barrier portions 30.

In the example of FIG. 1, the ceiling portions 28A-H are separated by partitions 34 that are substantially parallel to the rows 14 of server racks, and the ceiling portions 28A-H are equally spaced apart from the floor 12 of the room 10 in which the plurality of rows 14 of server racks are disposed.

Figure 2:
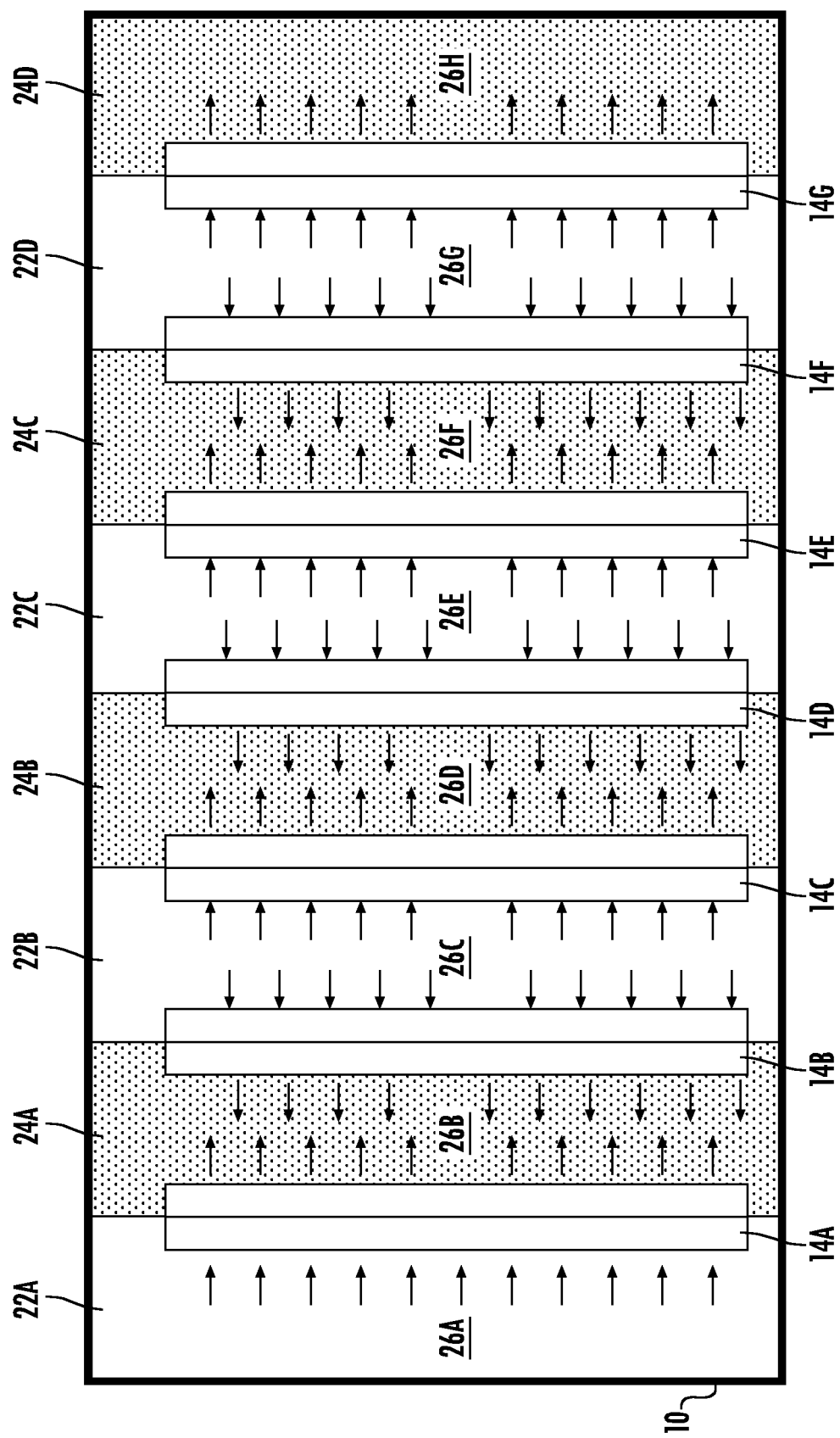
FIG. 2 is a schematic cross-sectional top view of the example room of FIG. 1 taken along line A-A in FIG. 1.

FIG. 2 is a schematic cross-sectional top view of the example room 10 of Figure taken along line A-A in FIG. 1. Referring now to FIG. 2 with continued reference to FIG. 1, in the depicted example each row 14 straddles a pair of adjacent convection room portions 26 and their associated convection regions 32. In particular, each row 14 straddles the room portion 26 of a supply aisle 22 and the room portion 26 of a return aisle 24.

The convection regions 26B-G which correspond to non-outer ones of the aisles 22, 24 act as convection regions for two flow paths. For example, convection region 32B of return aisle 24A acts as a convection region for the incoming flow paths that pass through each of the rows 14A-B. As another example, convection region 32C of supply aisle 22B acts as a convection region for the outgoing flow paths that pass through each of the rows 14B-C.

Figure 3:
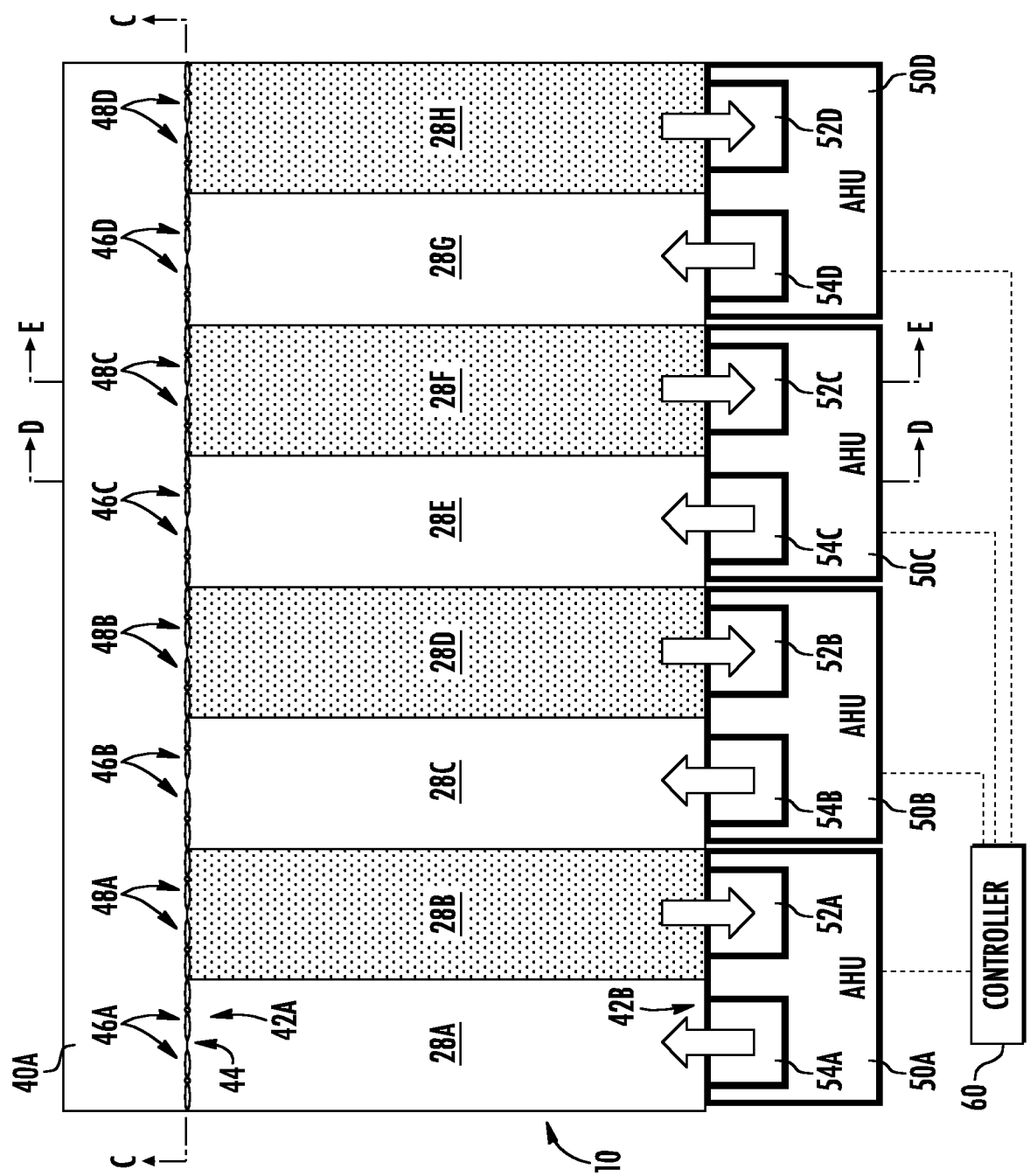
FIG. 3 is a schematic cross-sectional top view of the example room of FIG. 1 taken along line B-B in FIG. 1.

FIG. 3 is a schematic cross-sectional top view of the example room 10 of FIG. 1 taken along line B-B in FIG. 1. As shown in FIG. 3, a supply manifold 40A is provided at an end 42A of each of the ceiling portions 28A-H. The supply manifold 40A extends in a direction that is transverse and substantially perpendicular to that of the server racks 14 shown in FIG. 2. A wall 44 is separates the supply manifold 40A from the ceiling portions 28.

A plurality of first fans 46 are provided, each of which is associated with the supply manifold 40A and is configured to provide airflow between the supply manifold 40A and the ceiling portion 28 of an associated one the supply aisles 22 (i.e., ceiling portions 28A, 28C, 28E, 28G in FIG. 3). In particular, first fans 46A are associated with ceiling portion 28A, first fans 46B are associated with ceiling portion 28C, first fans 46C are associated with ceiling portion 28E, and first fans 46D are associated with ceiling portion 28G.

A plurality of second fans 48 are also provided, each of which is associated with a return manifold 40B (not shown in FIG. 3) and is configured to provide airflow between the return manifold 40B and the ceiling portion 28 of an associated one of the return aisles 24 (i.e., ceiling portions 28B, 28D, 28F, 28H in FIG. 3). In particular, second fans 48A are associated with ceiling portion 28B, second fans 48B are associated with ceiling portion 28D, second fans 48C are associated with ceiling portion 28F, and second fans 48D are associated with ceiling portion 28H.

In one example, the first fans 46 and second fans 48 are disposed in openings in the wall 44. Although each ceiling portion 28 is shown as having two associated first fans 46 or second fans 48, it is understood that other quantities of fans could be utilized for a given ceiling portion 28 (e.g., 1, 3, or more fans).

A plurality of air handling units (AHUs) 50A-D are disposed at end 42B of the ceiling portions 28. The plurality of AHUs 50 are located external to the plurality of rows 14 of server racks and are configured to utilize the ceiling portions 28 of the supply aisles 22 as supply ducts (through inlets 52A-D), and to utilize the ceiling portions 28 of the return aisles 24 as return ducts (through outlets 54A-D). Each AHU 50 cools the air received at its inlet 52 and outputs the cooled air through its outlet 54. Operation of AHUs is well known to those of ordinary skill in the art, and is therefore not discussed in detail herein. In the example of FIG. 3, the plurality of AHUs 50A-D are also external to the room 10.

A controller 60 is operatively connected to each of the AHUs 50A-D, and is operable to control the AHUs and the fans 46, 48.

In the example of FIG. 3, each first fan 46 and each second fan 48 are turned off. In one example, the controller 60 is configured to maintain the plurality of fans 46, 48 in an off state based on a lack of performance deficiencies in the plurality of AHUs 50A-D.

The first fans 46 and second fans 48 are is configured to provide airflow into their associated ceiling portions 28 from their associated manifold 40 in a first mode, and are configured to provide airflow into their associated manifold 40 from their associated ceiling portion 28 in a second mode. The controller 60 is operable to control whether each first fan 46 and each second fan 48 is off, in the second mode, or in the first mode, and is also operable to control a rotational speed of the first fans 46 and second fans 48.

Figure 4:
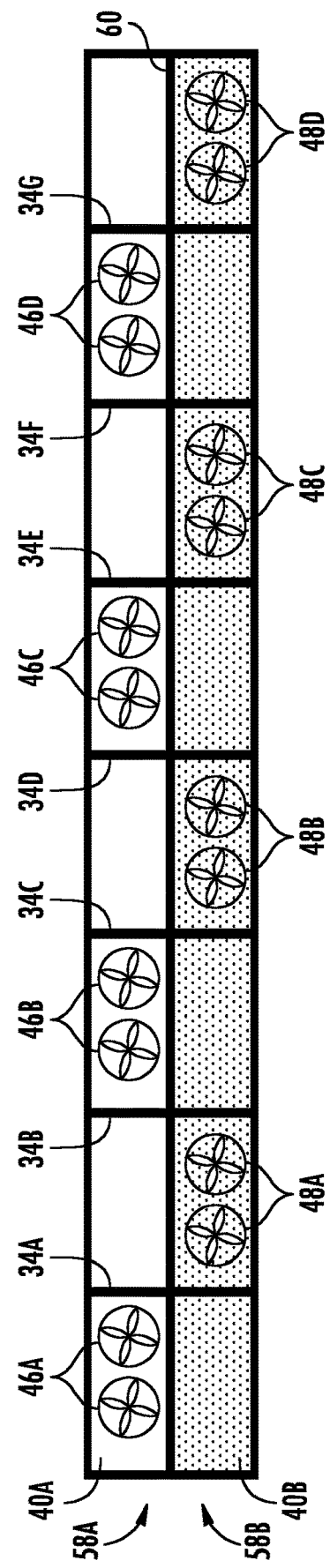
FIG. 4 is a schematic cross-sectional side view taken along line C-C in FIG. 3.

FIG. 4 is a schematic cross-sectional side view taken along line C-C in FIG. 3. As shown in FIG. 4, the supply manifold 40A is stacked above the return manifold 40B, such that each first fan 46 is arranged in a first row 58A, and each second fan 48 is disposed in a second row 58B that is vertically offset from the first row 58A. Of course, this is only an example, and other configurations could be used, such as where the return manifold 40B is stacked above the supply manifold 40A.

Figure 5A:
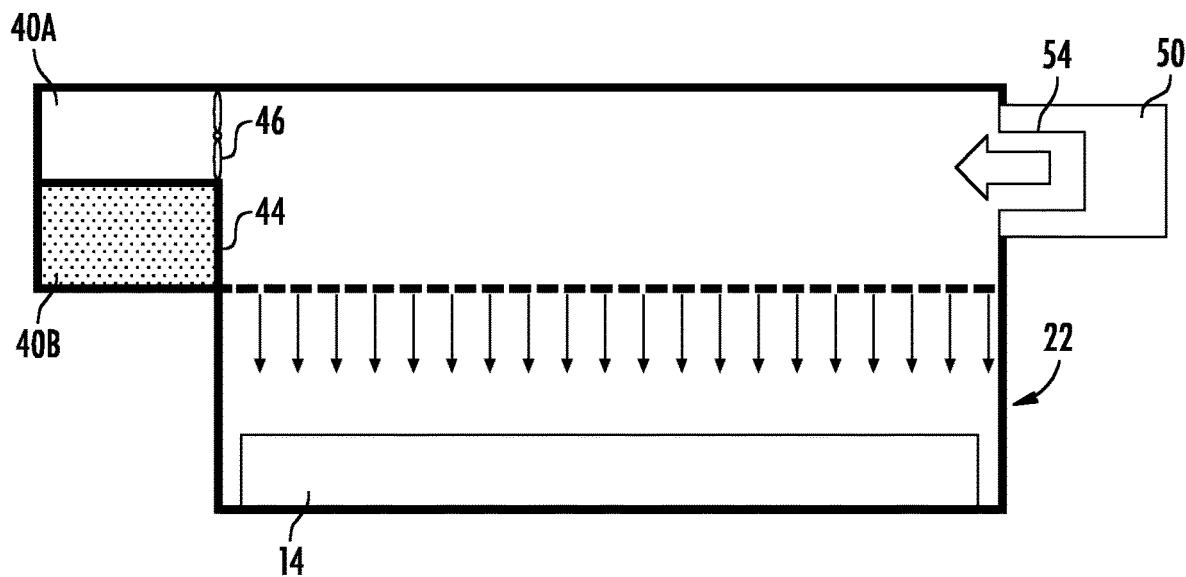
FIG. 5A is a schematic cross-sectional side view of a supply aisle taken along line D-D in FIG. 3.

FIG. 5A is a schematic cross-sectional side view of a supply aisle 22 taken along line D-D in FIG. 3. In FIG. 5A, the depicted first fan 46 is turned off.

Figure 5B:
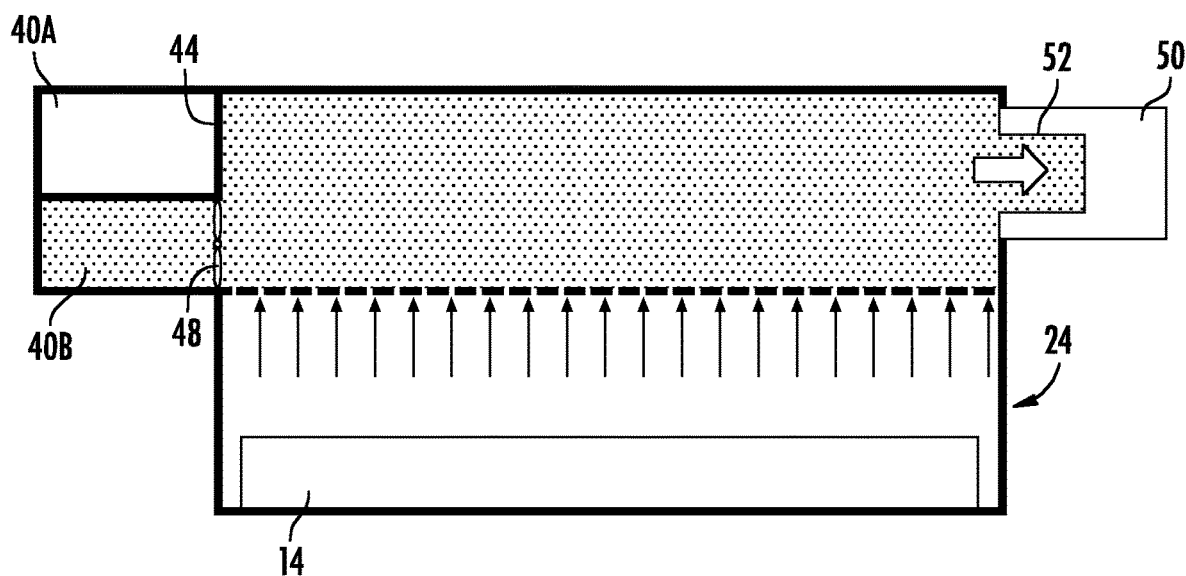
FIG. 5B is a schematic cross-sectional side view of a return aisle taken along line E-E in FIG. 3.

FIG. 5B is a schematic cross-sectional side view of a return aisle 24 taken along line E-E in FIG. 3. FIG. 5A, the depicted second fan 48 is turned off.

The controller 60 is configured monitor the AHUs 50, and detect performance deficiencies in the AHUs 50. In one example, to detect a performance deficiency in a particular one of the AHUs 50, the controller 60 is configured to detect that the particular one of the AHUs 50 is non-operational.

In one example, to detect a performance deficiency in a particular one of the AHUs 50, the controller 60 is configured to detect that the particular one of the AHUs 50 is unable to meet a temperature setpoint, which may occur even if the AHU 50 is operational. This could include, for example, if the AHU 50 is starting to fail or has a higher load than the other AHUs 50.

In one example, the first fans 46 and second fans 48 are all off when each AHU 50 is operating properly (i.e., not experiencing a performance deficiency), but are turned on in response to a detected performance deficiency in one of the AHUs 50.

For the discussion below, assume that the controller 60 determines that the AHU 50C is experiencing a performance deficiency (e.g., the AHU 50C will not turn on). Based on the detected performance deficiency of AHU 50C, the controller 60 operates the first fans 46 and second fans 48 to compensate.

Figure 6A:
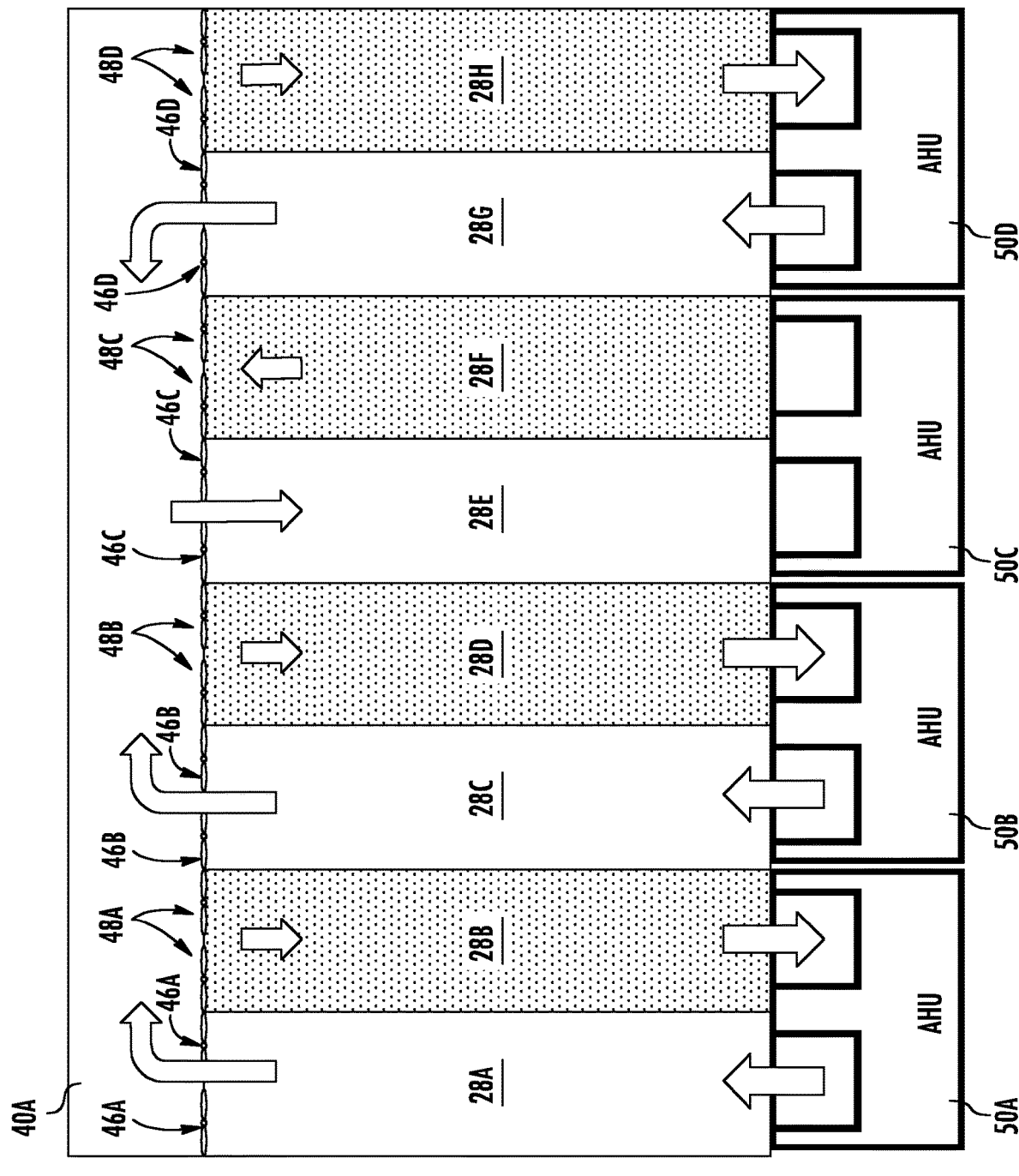
FIG. 6A is another schematic cross-sectional top view taken along line B-B in FIG. 1.

FIG. 6A is another schematic cross-sectional top view taken along line B-B in which flow paths are rerouted relative to the supply manifold 40A for the scenario described above. Based on the detected performance deficiency in AHU 50C, the controller 60 will increase the flow and duties of AHUs 50A, 50B and 50D in order to compensate for the lack of duty of AHU 50C. In particular, the controller 60 operates the first fans 46A, 46B, and 46D in the second mode to divert cooled air from the ceiling portions 28A, 28C, 28G into the supply manifold 40A, and operates the first fans 46C in the first mode to draw that cooled air into the ceiling portion 28E so that the supply aisle 22C still has a source of cooled air with the AHU 50C not functioning as desired.

Figure 6B:
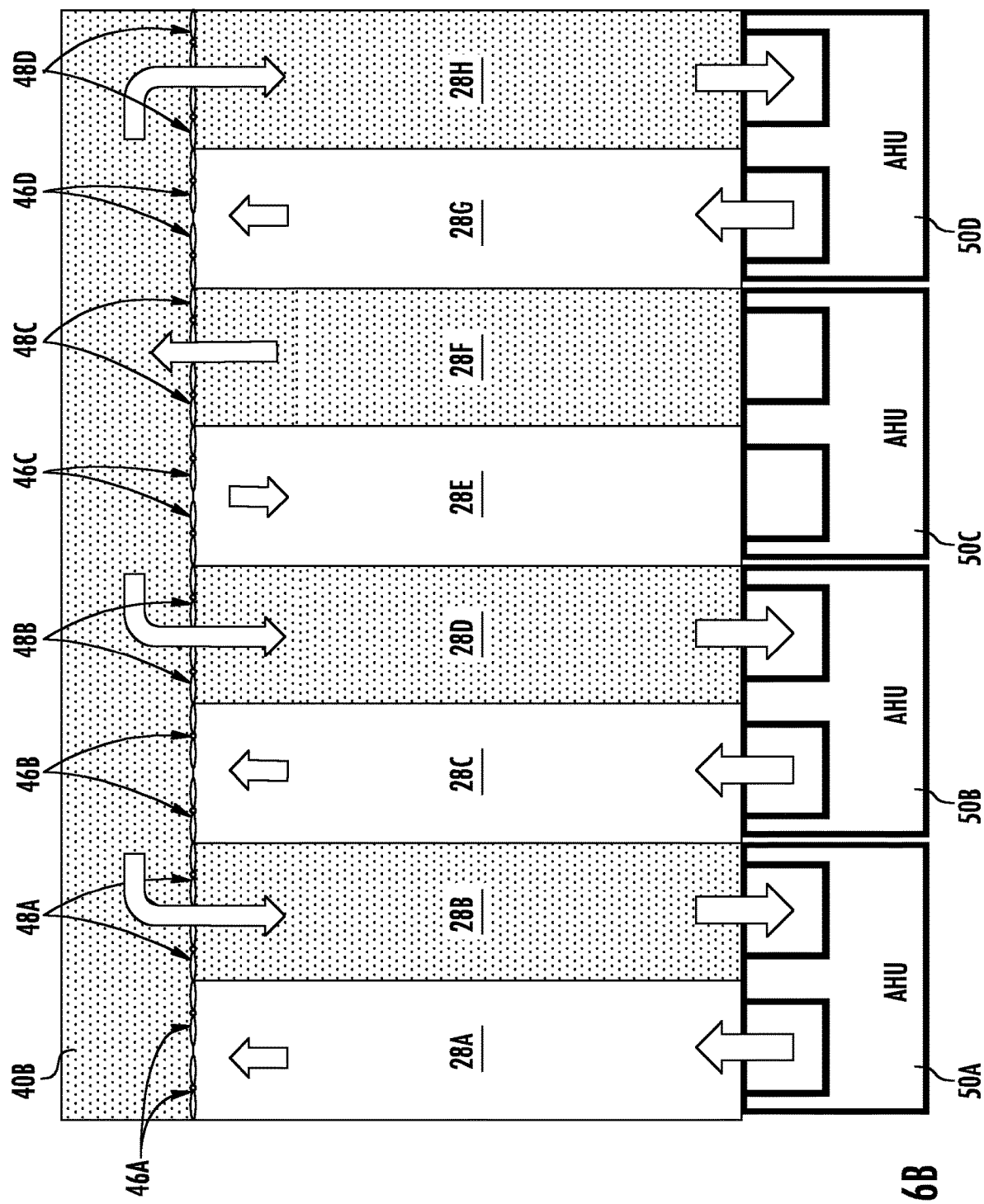
FIG. 6B is a schematic cross-sectional top view taken along line F-F in FIG. 1.

FIG. 6B is a schematic cross-sectional top view taken along line F-F in FIG. 1, which illustrates flow path rerouting relative to the return manifold 40B. Based on the detected performance deficiency in AHU 50C, the controller 60 operates the second fans 48C in the second mode to divert heated air from ceiling portion 28F into the return manifold 40B, and operates the second fans 48A, 48B, and 48D in the first mode to divert the heated air from the return manifold 40B into their respective ceiling portions 28B, 28D, 28H and then to their respective AHUs 50A, 50B, 50D which are functioning properly. Thus, the controller essentially reroutes the flow path of the ceiling portion 28E to rely on the supply manifold 40A instead of AHU 50C, and reroutes the flow path of the ceiling portion 28F to rely on the return manifold 40B instead of the AHU 50C.

Each fan 46, 48 can operate in "normal" sense of rotation ("normal mode"). In the "normal mode", each fan 46, 48 rotates in a first rotational direction and delivers design airflow in a first airflow direction (100% of flow or a fraction if the rotational speed of the fan is reduced). Also, each fan 46, 48 can operate in a "reverse mode" in which the fan rotates in an opposite second rotational direction and delivers airflow in a second, opposite airflow direction. Each fan 46, 48 has a first duty (e.g., 100% of its logical flow) and delivers a first amount of CFMs when operating at a given rotational speed in the "normal mode" and has a lower, second duty (e.g., 10-20% of the logical flow) and a smaller second amount of CFMs when operating in the "reverse mode" at the given rotational speed. The differing amount of airflow delivery between the two modes are due in part to the blades of each fan being designed to deliver airflow in the first airflow direction for the "normal mode," and having a more limited ability to deliver air in the opposite second airflow direction during the "reverse mode."

In one example, the "normal mode" for fans 46A-D corresponds to the "first mode" described above in which the fans 46A-D provide airflow into their associated ceiling portions 28 from their associated manifold 40A, and the "reverse mode" for the fans 46A-D corresponds to the "second mode" described above, in which the fans 46A-D provide airflow into their associated manifold 40A from their associated ceiling portion 28. Conversely, in this example, fans 48A-D are configured so that their "normal mode" corresponds to the "second mode" described above, and so that their "reverse mode" corresponds to the "first mode" described above.

In the example described above in which controller 60 detects a performance deficiency in AHU 50C, the first fans 46C rotate at one or more first speeds to draw cooled air into the ceiling portion 28E (first mode, which is their "normal mode"), and the first fans 46A, 46B, and 46D rotate at one or more second speeds which may be are slower than the first speeds to provide cooled air into the supply manifold 40A (second mode, which is their "reverse mode"). In one example, the first fans 46C operate to obtain approximately 100% of the supply flow for ceiling portion 28E, while first fans 46A, 46B, and 46D each operate to divert only a portion of their airflow (e.g., 10-20%) so that their cooling airflow is only partially diverted.

In the example described above, the second fans 48C rotate at one or more third speeds to expel heated air from the ceiling portion 28F into the return manifold 40B (second mode, which is their "normal mode"), and second fans 48A, 48B, and 48D rotate at one or more fourth speeds that may be slower than the third speeds to draw heated air out of the return manifold 40B (first mode, which is their "reverse mode"). In one example, the second fans 48C operate to expel approximately 100% of the return flow from ceiling portion 28F, while second fans 48A, 48B, and 48D each operate to incrementally increase the flow of return air that is provided to their respective AHUs 50A, 50B, 50D (e.g., an increase of 10-20%).

The "normal" and "reverse" modes described above exploit the fact that the fans 46, 48 may be designed to deliver a greater amount of CFMs in their normal mode than their reverse mode, because in the reverse mode a lower amount of CFMs is desired. Thus, if desired, prior art fans with known fan blade geometries could be used for the fans 46, 48 because a lower amount of airflow is generally desired by the controller 60 in their reverse modes, as described above.

Prior art air management systems 20 for server rooms of data centers typically relied on supply air being provided upwards from a flooring of a server room, and often had return vents on the sides of a server room, which provided for non-uniform air temperature and velocity fields. The various embodiments discussed above improve on prior art systems by providing symmetrical air distribution, more uniform air temperature and velocity fields, and require less spaced because sub-flooring ductwork is not required.

Also, the supply manifold 40A, return manifold 40B, first fans 46, and second fans 48 provide for rerouting airflow in the event that a particular AHU 50 is not performing as desired, which could include a complete failure of the AHU 50, or could include the AHU 50 failing to meet its temperature setpoint. This provides for redundancy, which can be important to data center customers who cannot tolerate downtime for their servers. Also, the rerouting could be used in load balancing scenarios to better distribute the load applied to each AHU 50.

In this disclosure, like reference numerals designate like elements where appropriate and reference numerals with the addition of one-hundred or multiples thereof designate modified elements that are understood to incorporate the same features and benefits of the corresponding elements.

The embodiments described above describe the air management system 20 as using a downward supply airflow from ceiling portions 28 and an upward return airflow to the ceiling portions 28 through vented barrier portions 30.

Figure 7:
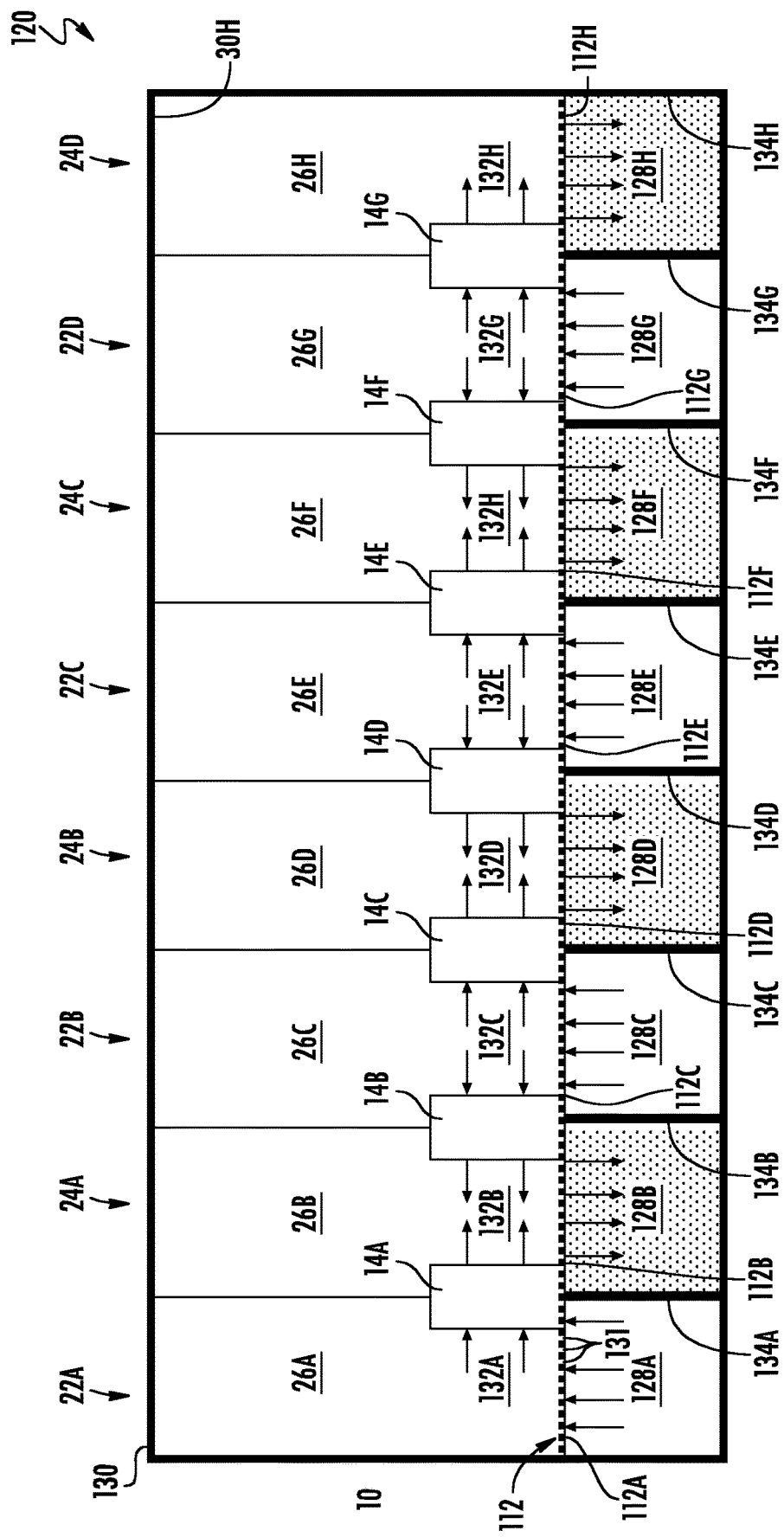
FIG. 7 is a schematic side view of an alternate air management system for a room containing rows of electrical equipment.

FIG. 7 illustrates a schematic view of another example air management system 120 for a room 110 that includes rows 14 of electrical equipment. However, in the alternate embodiment of FIG. 7, the floor 112 is vented instead of the ceiling 130 being vented, and instead of using ceiling portions 28 for supply and return ducts, the air management system 120 instead uses subfloor portions 128A-B that are located beneath the floor 112 and are separated by partitions 134A-G that are substantially parallel to the rows 14. The plurality of subfloor portions 128A-B provide an upward supply airflow to the convection regions 132A, 132C, 132E, 132G and receive a downward supply of return airflow from the convection regions 132B, 132D, 132F, 132H. Each subfloor portion 128 includes a plurality of openings schematically shown as 131 that are substantially directed towards their corresponding convection region 132. In the embodiment of FIG. 7, the manifolds 40A-B could be located beneath the floor 112, and the fans 46, 48 could operate in the same manner that is described above.

Although example embodiments have been disclosed, a worker of ordinary skill in this art would recognize that certain modifications would come within the scope of this disclosure. For that reason, the following claims should be studied to determine the scope and content of this disclosure.

What is claimed is:

1. An air management system, comprising:
    a plurality of rows of electrical equipment that are laterally spaced apart from each other, each row providing a flow path from a convection region on a first side of the row to a different convection region on an opposite second side of the row;
    a plurality of supply aisles and a plurality of return aisles interposed between each other, each supply aisle and each return aisle having a respective room portion that includes a respective one of the convection regions, a respective ceiling portion disposed above the room portion, and a vented barrier portion therebetween, each supply aisle providing airflow downwards from its respective ceiling portion through its vented barrier portion to its convection region, and each return aisle providing airflow flow upwards from its convection region through its vented barrier portion to its respective ceiling portion;
    a plurality of air handling units (AHUs) located external to the plurality of rows and configured to utilize the ceiling portions of the supply aisles as supply ducts, and utilize the ceiling portions of the return aisles as return ducts;
    a supply manifold and a return manifold disposed at an end of the ceiling portions and transverse to the rows of electrical equipment;
    a plurality of first fans, each associated with the supply manifold and configured to provide airflow between the supply manifold and the ceiling portion of an associated one the supply aisles; and
    a plurality of second fans, each associated with the return manifold and configured to provide airflow between the return manifold and the ceiling portion of an associated one of the return aisles;
    wherein each first fan and each second fan is configured to provide airflow into its associated ceiling portion from its associated manifold in a first mode, and provide airflow into its associated manifold from its associated ceiling portion in a second mode.

2. The air management system of claim 1, wherein the ceiling portions are separated by partitions substantially parallel to the rows of electrical equipment.

3. The air management system of claim 1, wherein the ceiling portions are equally spaced apart from a floor of a room in which the plurality of rows of electrical equipment are disposed.

4. The air management system of claim 1, wherein:
    each fan is configured to have a normal mode in which airflow is provided in a first direction, and a reverse mode in which airflow is provided in an opposing second direction, each fan delivering less airflow in the second direction in the reverse mode at a given rotational speed than in the first direction in the normal mode at the given rotational speed;
    for the first fans, the first mode is the normal mode, and the second mode is the reverse mode; and
    for the second fans, the first mode is the reverse mode, and the second mode is the normal mode.

5. The air management system of claim 1, wherein:
    the supply manifold is stacked above or beneath the return manifold, such that each first fan is arranged in a first row, and each second fan is disposed in a second row that is vertically offset from the first row.

6. The air management system of claim 1, comprising a controller configured to:
    detect a performance deficiency in a particular one of the AHUs associated with a particular supply aisle and a particular return aisle; and
    based on the detection:
        operate each first fan associated with the particular supply aisle in the first mode and at one or more first speeds; and
        operate each second fan associated with the particular return aisle in the second mode and at one or more second speeds.

7. The air management system of claim 6, wherein the controller is configured to, based on the detection:
    operate each first fan not associated with the particular supply aisle in the second mode at one or more speeds that are less than the one or more first speeds; and
    operate each second fan not associated with the particular return aisle in the first mode and at one or more speeds that are less than the one or more second speeds.

8. The air management system of claim 6, wherein the controller is configured to maintain the plurality of first fans and second fans in an off state based on a lack of performance deficiencies in the plurality of AHUs.

9. The air management system of claim 6, wherein to detect a performance deficiency in a particular one of the AHUs, the controller is configured to detect that the particular one of the AHUs is non-operational or that the particular one of the AHUs is unable to meet a temperature setpoint.

10. A method of cooling a room containing electrical equipment, comprising:
    providing respective flow paths through each of a plurality of rows of electrical equipment that are laterally spaced apart from each other in a room, each flow path extending from a convection region on a first side of a given row to a different convection region on an opposite second side of the given row;
    providing, for each of a plurality of supply aisles, a downward airflow from a ceiling portion of the supply aisle through a respective vented barrier portion into the convection region of a room portion of the supply aisle;
    providing, for each of a plurality of return aisles, an upward airflow from the convection region of a room portion of the return aisle, through a respective vented barrier portion, into a ceiling portion of the return aisle, the supply aisles and the return aisles interposed between each other;

utilizing the ceiling portions of the supply aisles as supply ducts, and utilizing the ceiling portions of the return aisles as return ducts for a plurality of air handling units (AHUs);

providing a supply manifold and a return manifold at an end of the ceiling portions, the supply manifold and return manifold transvers to the rows of electrical equipment;

providing a plurality of first fans that are each associated with the supply manifold and configured to provide airflow between the supply manifold and the ceiling portion of an associated one the supply aisles; and providing a plurality of second fans that are each associated with the return manifold and configured to provide airflow between the return manifold and the ceiling portion of an associated one of the return aisles;

wherein each first fan and each second fan is configured to provide airflow into its associated ceiling portion from its associated manifold in a first mode, and provide airflow into its associated manifold from its associated ceiling portion in a second mode.

11. The method of claim 10, comprising:
separating the ceiling portions by a plurality of partitions that are substantially parallel to the rows of electrical equipment.

12. The method of claim 10, comprising:
providing each ceiling portion at a same distance from a floor of the room.

13. The method of claim 10, wherein:
each fan is configured to have a normal mode in which airflow is provided in a first direction, and a reverse mode in which airflow is provided in an opposing second direction, each fan delivering less airflow in the second direction in the reverse mode at a given rotational speed than in the first direction in the normal mode at the given rotational speed;
operating the first fans in the first mode comprises operating the first fans in the normal mode;
operating the first fans in the second mode comprises operating the first fans in the reverse mode;
operating the second fans in the first mode comprises operating the first fans in the reverse mode; and
operating the second fans in the second mode comprises operating the first fans in the normal mode.

14. The method of claim 10, wherein:
said providing a plurality of first fans comprises providing the plurality of first fans in a first row; and
said providing a plurality of second fans comprises providing the plurality of second fans in a second row that is stacked above or below the first row.

15. The method of claim 10, comprising:
detecting a performance deficiency in a particular one of the AHUs associated with a particular supply aisle and a particular return aisle; and
based on said detecting:
  operating each first fan associated with the particular supply aisle in the first mode and at one or more first speeds; and
  operating each second fan associated with the particular return aisle in the second mode and at one or more second speeds.

16. The method of claim 15, comprising, based on the detecting:
  operating each first fan not associated with the particular supply aisle in the second mode at one or more speeds that are less than the one or more first speeds; and
  operating each second fan not associated with the particular return aisle in the first mode and at one or more speeds that are less than the one or more second speeds.

17. The method of claim 15, comprising:
maintaining the plurality of first fans and second fans in an off state based on a lack of performance deficiencies in the plurality of AHUs.

18. The method of claim 15, wherein said detecting a performance deficiency in a particular one of the AHUs comprises detecting that the particular one of the AHUs is non-operational or is unable to meet its temperature setpoint.

* * * * *